United States Patent [19]
Baird et al.

[11] Patent Number: 5,583,747
[45] Date of Patent: Dec. 10, 1996

[54] THERMOPLASTIC INTERCONNECT FOR ELECTRONIC DEVICE AND METHOD FOR MAKING

[76] Inventors: John H. Baird, 6427 E. Gold Dust Ave., Scottsdale, Ariz. 85253; Francis J. Carney, 602 E. Sagebrush St., Gilbert, Ariz. 85234

[21] Appl. No.: 436,055

[22] Filed: May 5, 1995

Related U.S. Application Data

[63] Continuation of Ser. No. 143,959, Nov. 1, 1993, abandoned.

[51] Int. Cl.⁶ ..................... H05K 7/10
[52] U.S. Cl. ............. 361/767; 361/769; 361/771; 361/779; 257/738; 228/180.21
[58] Field of Search .................. 257/736, 737, 257/738, 779, 780; 228/180.21, 180.22; 361/779, 769, 771, 767

[56] References Cited

U.S. PATENT DOCUMENTS

| | | |
|---|---|---|
| 5,235,741 | 8/1993 | Mase . |
| 5,241,133 | 8/1993 | Mullen, III et al. ............ 174/52.4 |
| 5,262,351 | 11/1993 | Bureau et al. ............ 437/183 |

FOREIGN PATENT DOCUMENTS

| | | |
|---|---|---|
| 1220836A | 4/1989 | Japan . |
| 1220836 | 9/1989 | Japan . |
| 215660A | 1/1990 | Japan . |

OTHER PUBLICATIONS

W. C. Ward, "Pressure Contact Type Chip Join Technique," IBM Technical Disclosure Bulletin, vol. 18, No. 9, Feb. 1976, p. 2817.

*Primary Examiner*—Leo P. Picard
*Assistant Examiner*—Y. Whang

[57] ABSTRACT

Conductive thermoplastic interconnects (120) for electronic devices are disclosed. The interconnects may take the form of bumps or spheres, and may be used in applications where metal bumps are conventionally used. Bumps (310) may be attached by retaining them in a vacuum fixture (312) and momentarily contacting them with the substrate (316) requiring the bumps (310). The substrate (316) has been heated sufficiently to cause wetting of the conductive thermoplastic bump (310).

10 Claims, 1 Drawing Sheet

THERMOPLASTIC INTERCONNECT FOR ELECTRONIC DEVICE AND METHOD FOR MAKING

This application is a continuation of prior application Ser. No. 08/143,959, filed Nov. 1, 1993 is now abandoned.

FIELD OF THE INVENTION

The present invention relates, in general, to electronic devices, and more particularly to electronic devices comprising conductive thermoplastic spheres.

BACKGROUND OF THE INVENTION

Conductive bumps are presently being used in a variety of ways in conventional electronic devices and, particularly in, semiconductor device packaging. For example, conductive bumps are widely used for interconnect between ceramic or organic substrates and printed circuit boards, between die pads and base substrates, and between die surfaces. The conventional conductive bumps comprise metallic materials. Some examples of commonly used metallic materials are Sn, Pb, Ag, In, Bi, Au, Sb, in either their pure or alloyed forms.

The conventional metallic conductive spheres give rise to significant problems and disadvantages within the context of electronic device packaging. More specifically, prolonged thermal treatments of alloyed metallic materials can cause segregation of base metals and unwanted intermetallic formation. This segregation of base metals and intermetallic formation can cause electrical and thermal conductivity problems and loss of mechanical integrity. There are also significant problems associated with the requirement to apply flux to reduce the metallic oxidation and obtain a solderable interface. Many flux applications require cleaning of the flux residues after soldering, and possible ionic contamination associated with certain types of flux materials.

Consequently, what is needed is an electronic device having conductive interconnect paths which do not form intermetallics, oxidize, or require cleaning of flux residues, and which will not exhibit loss of structural integrity for these reasons.

DETAILED DESCRIPTION OF THE DRAWINGS

Conductive thermoplastic material is used to make multiple electrical contacts between a semiconductor device and its associated circuitry. The circuitry is typically on a printed wiring board. The conductive thermoplastic material also provides the necessary structural attachment of the device to the board so that its function replaces the conventional metallic solders.

One method of employing the novel thermoplastic connector scheme involves the use of spheres of controlled size. Cold spheres are brought into contact with the substrate, package, board, die, etc., which are at a high process temperature. The spheres are arranged in a pattern matching the contact pattern. The contacting portion of the spheres melt and adhere to the hot surface. The adhering spheres form bumps of conductive material which now enable subsequent attachment to another surface (e.g. printed wire board) using a similar process.

Figure 1:
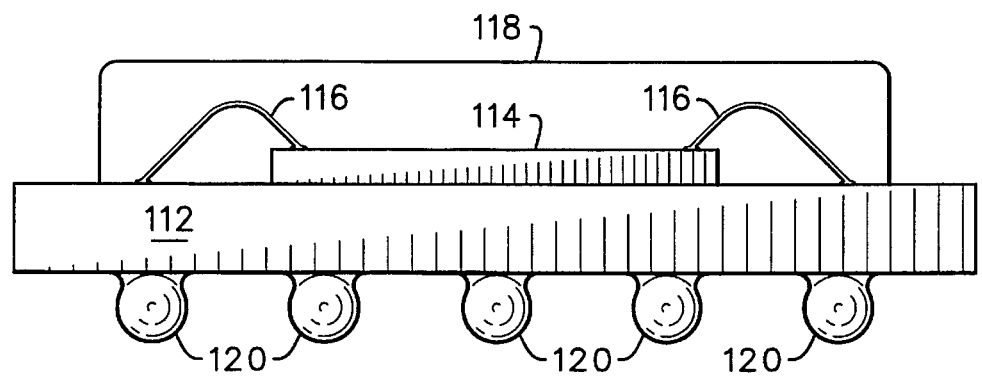
FIG. 1 is a simplified cross-sectional side view of one embodiment of an electronic device in accordance with the present invention.

Turning now to the figures for a more detailed understanding, FIG. 1 is a simplified cross-sectional side view of one embodiment of an electronic device in accordance with the present invention. FIG. 1 represents an overmolded pad array carrier (OMPAC) 110. OMPAC 110 is a packaged electronic device comprising device substrate 112. Semiconductor die 114 is mounted according to well known methods to device substrate 112. Wire bonds 116 represent a plurality of wire bonds which electrically connect semiconductor die 114 to substrate 112. Substrate 114 and wire bonds 116 are overmolded with molding compound 118. Thus, the OMPAC provides a chip carrying package.

According to the embodiment of FIG. 1, conductive thermoplastic bumps 120 are distributed about the bottom surface of OMPAC 110. Conductive thermoplastic bumps 120 are illustrated as substantially spherical. However, it should be understood that the shape of the bumps may vary, depending on the particular application, the manner in which they have been attached, the stage of processing, etc.

In the described embodiment, thermoplastic spheres available from Alphametals™ are employed. The preferred thermoplastic spheres produced by Alphametals™ are filled with a conductive silver filler of various shapes and sizes designed to produce high electrical conductivity in the sphere, hence between die and substrate without any segregation of the filler material during the sphere formation or the attach processes. It should be apparent that other conductive thermoplastics may be used, some having no filler.

The spheres can be designed to melt at various temperatures depending on the thermoplastic composition chosen. The wetting temperatures chosen for the thermoplastic used in the OMPAC type of application should be about 150° C., but any number of higher or lower temperatures could be chosen depending on the application.

The spheres will not have to be completely reflowed to achieve good wetting to the base substrate or package although a complete reflow would also work depending on the application. The attach process does not require any flux application since there is not an outer layer of oxide formed on the thermoplastic spheres. The thermoplastic resin when near melt temperature will wet and adhere to a variety of surfaces including room atmosphere oxidized metals. Oxide reduction/removal is not required. The lack of necessity of the flux application also eliminates the need for a cleaning step after the spheres are attached. The thermoplastic interconnects will not form intermetallics with the base substrate or die since the plastic does not react with any metal species or enable diffusion of metallic species.

Figure 2:
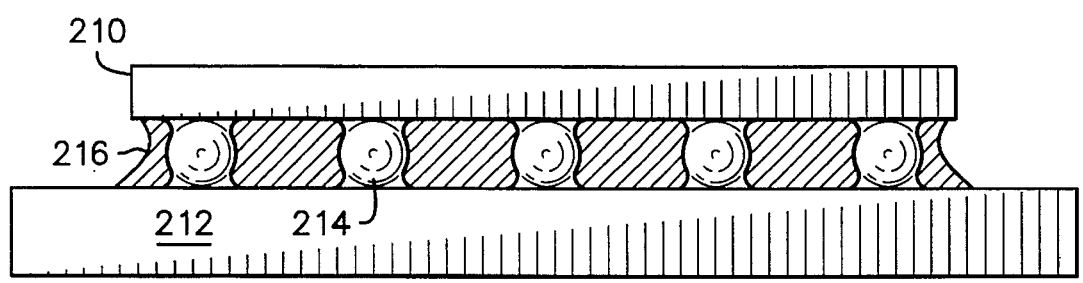
FIG. 2 is a simplified cross-section of an alternate embodiment of an electronic device in accordance with the present invention.

FIG. 2 illustrates an alternate embodiment in accordance with the present invention. More specifically, FIG. 2 illustrates a semiconductor die 210 attached to a substrate 212 using conductive thermoplastic bumps 214. It should be understood by those skilled in the art that semiconductor die 210 comprises an electronic device formed in the die according to conventional processes. The conductive thermoplastic paths 214 provide electrical contacts for operating and utilizing the electronic device of semiconductor die 210. Semiconductor die 210 provides one substrate to which the conductive thermoplastic bumps 214 are attached. Substrate 212 provides a second substrate to which thermoplastic bumps 214 are attached.

Substrate 212 represents a variety of different substrates, including the substrate of a package (similar to 112 of FIG. 1), or a flat panel display which might be driven by the device of 210. The thermoplastic spheres are particularly useful for display-type applications due to their extreme wetability at low temperatures. These are merely examples, and it will be understood by those skilled in the art that the arrangement schematically shown in FIG. 2 has very broad application.

The arrangement illustrated in FIG. 2 also comprises heat conducting electrically insulating material 216 which has been inserted between conductive thermoplastic bumps 214, sandwiched between die 210 and substrate 212. This thermally conductive material 216 serves several purposes including heat dissipation between the die and substrate, and also provides added mechanical adhesion between the two surfaces. An example of such a material would be an elastomeric thermosetting aluminum nitride filled liquid material placed between the device and the board after the device has been attached to the substrate. Surface tension causes it to be drawn between the substrate and die filling the entire interface. Many such materials are commercially available which are designed for this purpose. Vendors include Ablestick™ and Dexte.

Figure 3:
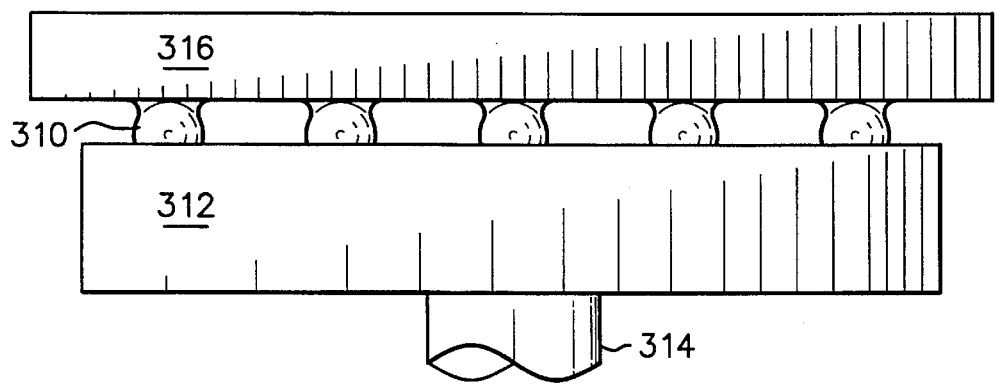
FIG. 3 is a simplified side view illustrating an example method of making an electronic device in accordance with the present invention.

FIG. 3 is a simplified side view illustrating a method for attaching thermoplastic spheres to a substrate. FIG. 3 illustrates spheres 310 being retained in vacuum fixture 312. Vacuum fixture 312 includes recessed areas (hidden in this view) which hold the thermoplastic spheres 310 in place when a vacuum is applied to vacuum access 314. Spheres 310 are being attached to substrate 316. Substrate 316 represents a variety of substrates, including a semiconductor die or a substrate of an electronic device package, module, or printed circuit board to name a few.

One method for attaching conductive thermoplastic spheres 310 is as follows. The substrate 316 is heated to a temperature sufficient to cause the spheres 310 to wet to lands on the substrate (lands not shown in the view of FIG. 3). The spheres 310 are placed in the vacuum fixture 312 and brought into contact with the heated substrate 316.

Once thermoplastic spheres 310 contact heated substrate 316 under pressure they wet to the substrate without a complete reflow. This wetting action provides mechanical adhesion to the substrate and an electrically conductive interface between the substrate 316 and the thermoplastic sphere 310. Once the spheres 310 are attached to the substrate 316, the substrate 316 is cooled.

As an example of further processing, substrate 316 with attached spheres 310 may later be coupled to a semiconductor die. In such case, the semiconductor die would be heated to a temperature sufficient to wet spheres 310. The heated semiconductor device is then brought into contact with the thermoplastic spheres 310 already attached to the substrate 316. Sufficient pressure is applied to cause a second wetting action to the semiconductor die.

It should be noted that this process does not require complete reflow of the thermoplastic sphere in order to form an interconnect between the device and board. In ordinary solder ball interconnect a complete reflow cycle is used to provide a similar interconnect. Once the device and board have been joined by the conductive thermoplastic spheres a suitable underfill material (similar to filler 216 shown in FIG. 2) could be used to provide enhanced thermal conduction between the substrate and die, as well as added mechanical adhesion.

It should be noted that this process does not require complete reflow of the conductive thermoplastic sphere. Therefore, the conductive thermoplastic sphere has an "hour glass" shape between the die and substrate. This "hour glass" shape of bumps 310 has added reliability as is well known to those skilled in the art. This process does not require any flux application which is required for conventional metal solder ball interconnect. With the elimination of the flux step the need for a post cleaning cycle is also eliminated.

What has been provided is a means and method of generating multiple electrically interconnecting paths between electronic devices using electrically conductive thermoplastic spheres avoiding many of the problems of current practice using metallic interconnects.

Conductive paths are made quickly by momentary contact with the thermoplastic sphere or bump, without the need or use of fluxes, reflow, or cleaning processes, and with substrates at relatively low temperature. The conductive paths so made are electrically and structurally stable since there is no possibility of generating structural faults by alloy diffusion as for metallic interconnects.

We claim:

1. A method for making an electronic device comprising the steps of:

providing a device substrate; and attaching a conductive thermoplastic interconnect bump to a surface of the device substrate by heating the device substrate and mating the device substrate and the conductive thermoplastic interconnect bump, wherein the step of attaching the conductive thermoplastic interconnect bump to the surface of the device substrate includes using heat from the device substrate to wet the conductive thermoplastic interconnect bump and to provide mechanical adhesion between the device substrate and the conductive thermoplastic interconnect bump.

2. The method of claim 1 further comprising the steps of heating a module substrate and mating the module substrate and the conductive thermoplastic interconnect bump, wherein the step of mating the module substrate and the conductive thermoplastic interconnect bump includes using heat from the module substrate to wet the conductive thermoplastic interconnect bump to provide mechanical adhesion between the conductive thermoplastic interconnect bump and the module substrate.

3. The method of claim 1, wherein the step of attaching comprises attaching the conductive thermoplastic interconnect bump while it is at least partially solid.

4. The method of claim 1, wherein the step of attaching comprises retaining the conductive thermoplastic interconnect bump in a vacuum fixture prior to the step of mating the device substrate and the conductive thermoplastic interconnect bump.

5. The method of claim 1, further comprising the step of surrounding the conductive thermoplastic interconnect bump with a heat conducting material.

6. A method for making an electronic device comprising the steps of:

providing a device substrate; and attaching a conductive thermoplastic interconnect bump to a surface of the device substrate by heating the conductive thermoplastic interconnect bump with infrared radiation.

7. The method of claim 6 further comprising the step of heating a module substrate and mating the module substrate and the conductive thermoplastic interconnect bump.

8. The method of claim 6, wherein the step of attaching comprises attaching the conductive thermoplastic interconnect bump while it is at least partially solid.

9. The method of claim 6, further comprising the step of surrounding the conductive thermoplastic interconnect bump with a heat conducting material.

10. A method for making an electronic device comprising the steps of:

providing a device substrate; and attaching a conductive thermoplastic interconnect bump to a surface of the device substrate by retaining the conductive thermoplastic interconnect bump in a vacuum fixture and mating the device substrate and the conductive thermoplastic interconnect bump.

\* \* \* \* \*

UNITED STATES PATENT AND TRADEMARK OFFICE
CERTIFICATE OF CORRECTION

PATENT NO. : 5,583,747
DATED : December 10, 1996
INVENTOR(S) : John Baird
Francis J. Carney It is certified that error appears in the above-indentified patent and that said Letters Patent is hereby corrected as shown below:

Please change inventors code to [75].

Please add Assignee and code:
    [73] Assignee: Motorola, Inc., Schaumburg, IL.

Signed and Sealed this

Twenty-eighth Day of October, 1997

Attest:

BRUCE LEHMAN

Attesting Officer

Commissioner of Patents and Trademarks